(12) United States Patent
Gasse et al.

(10) Patent No.: US 11,094,742 B2
(45) Date of Patent: Aug. 17, 2021

(54) METHOD FOR PRODUCING A PHOTO-EMITTING AND/OR PHOTO-RECEIVING DEVICE WITH A METAL OPTICAL SEPARATION GRID

(71) Applicant: COMMISSARIAT A L'ENERGIE ATOMIQUE ET AUX ENERGIES ALTERNATIVES, Paris (FR)

(72) Inventors: Adrien Gasse, Grenoble (FR); Ludovic Dupre, Grenoble (FR); Marion Volpert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/851,165

(22) Filed: Apr. 17, 2020

(65) Prior Publication Data
US 2020/0343296 A1    Oct. 29, 2020

(30) Foreign Application Priority Data

Apr. 26, 2019  (FR) ...................................... 19 04433

(51) Int. Cl.
*H01L 27/15* (2006.01)
*H01L 33/00* (2010.01)
(Continued)

(52) U.S. Cl.
CPC ........ *H01L 27/156* (2013.01); *H01L 27/1443* (2013.01); *H01L 27/1446* (2013.01);
(Continued)

(58) Field of Classification Search
CPC ............... H01L 27/156; H01L 27/1443; H01L 33/0093; H01L 33/385; H01L 33/502;
(Continued)

(56) References Cited

U.S. PATENT DOCUMENTS 7,187,009 B2 * 3/2007 Fukasawa ............... H01L 24/97
257/88
10,243,122 B2 * 3/2019 Ito ......................... H01L 33/501
(Continued)

FOREIGN PATENT DOCUMENTS

WO    WO 2017/068029 A1    4/2017

OTHER PUBLICATIONS

U.S. Appl. No. 16/472,037, filed Jun. 20, 2019, 2020/0035864 A1, Chambion, B, et al.
(Continued)

*Primary Examiner* — Sitaramarao S Yechuri
(74) *Attorney, Agent, or Firm* — Oblon, McClelland, Maier & Neustadt, L.L.P.

(57) ABSTRACT

A method for producing a photo-emitting and/or photo-receiving device with a metal optical separation grid, comprising at least:
  producing at least one photo-emitting and/or photo-receiving component, wherein at least one first metal electrode of the photo-emitting and/or photo-receiving component covers side flanks of at least one semiconductor stack of the photo-emitting and/or photo-receiving component and extends to at least one emitting and/or receiving face of the photo-emitting and/or photo-receiving component;
  treating at least one face of the first metal electrode located at the emitting and/or receiving face, rendering wettable said face of the first metal electrode;
(Continued)

producing of the metal optical separation grid on at least one support;

fastening of the metal optical separation grid against said face of the first metal electrode by brazing;

removing the support.

14 Claims, 10 Drawing Sheets

(51) Int. Cl.
*H01L 27/144* (2006.01)
*H01L 31/0224* (2006.01)
*H01L 31/0232* (2014.01)
*H01L 31/18* (2006.01)
*H01L 33/38* (2010.01)
*H01L 33/50* (2010.01)

(52) U.S. Cl.
CPC ............... *H01L 31/02322* (2013.01); *H01L 31/022408* (2013.01); *H01L 31/1892* (2013.01); *H01L 33/0093* (2020.05); *H01L 33/385* (2013.01); *H01L 33/502* (2013.01); *H01L 33/505* (2013.01); *H01L 2933/0016* (2013.01); *H01L 2933/0041* (2013.01)

(58) Field of Classification Search
CPC ..... H01L 33/505; H01L 33/405; H01L 33/58; H01L 33/60; H01L 31/022408; H01L 31/02322; H01L 31/1892; H01L 31/0232; H01L 31/02327; H01L 31/125; H01L 2933/0016; H01L 2933/0041; H01L 2933/0058

See application file for complete search history.

(56) References Cited

U.S. PATENT DOCUMENTS

| | | | |
|---|---|---|---|
| 2013/0170805 A1* | 7/2013 | McBroom | G01T 1/1644 385/129 |
| 2013/0221392 A1* | 8/2013 | Engl | H01L 33/382 257/98 |
| 2014/0264685 A1* | 9/2014 | Cheng | H01L 31/18 257/432 |
| 2015/0036219 A1* | 2/2015 | Shen | G02B 3/0037 359/619 |
| 2015/0362165 A1* | 12/2015 | Chu | H01L 27/156 362/235 |
| 2016/0027980 A1* | 1/2016 | Hahn | H01L 25/0753 257/88 |
| 2017/0162737 A1* | 6/2017 | Bitnar | H01L 31/0201 |
| 2017/0212253 A1* | 7/2017 | Fu | A61B 6/4241 |
| 2018/0261736 A1* | 9/2018 | Bonar | H01L 33/60 |
| 2019/0123033 A1* | 4/2019 | Martin | H01L 25/0753 |

OTHER PUBLICATIONS

French Preliminary Search Report dated Jan. 8, 2020 in French Application 19 04433 filed on Apr. 26, 2019 (with English Translation of Categories of Cited Documents), 2 pages.

\* cited by examiner

METHOD FOR PRODUCING A PHOTO-EMITTING AND/OR PHOTO-RECEIVING DEVICE WITH A METAL OPTICAL SEPARATION GRID

TECHNICAL FIELD AND PRIOR ART

The invention relates to the field of devices with photo-emitting diode, such as light-emitting diodes (named LEDs, or micro-LEDs), and/or with photo-receiving diodes such as photodiodes. This document applies in particular to the following fields:

- LEDs lighting devices, electronic devices comprising LED matrices such as screens, projectors or video walls;
- photo-receiving microelectronic or electronic devices including photodiode matrices, such as image sensors;
- devices including both photo-emitting diodes and photo-receiving diodes, forming for example both a sensor and a screen.

In a photo-emitting and/or photo-receiving diodes device, it is often advantageous to increase the resolution of the device, i.e. increase the number of active cells, or pixels, by surface unit of the device. This increase in the resolution involves both decreasing the unit size of the pixels and improving the optical separation of the pixels between them in order to decrease in particular the "cross talk", i.e. the optical interferences that occur between adjacent pixels. In the case of pixels comprising photo-emitting diodes, the increase in their directivity also participates in the increase in the resolution that can be reached by the device.

Furthermore, this increase in the resolution must be done by limiting the losses linked to the sensitivity of the reception and/or of the emissivity of the devices, which implies that the reduction in the useful or sensitive surface of the pixels, i.e. the reception and/or emission surface of the pixels, be accompanied by a reduction in the surface of the peripheral dead zones, i.e. of the surface that does not emit or that does not receive light, which correspond for example to the regions occupied by the electrodes of the diodes and by the insulation regions located between and around pixels. This reduction in the surface of the peripheral dead zones involves minimising their width around pixels while still maintaining or improving the optical separation between the pixels.

In the current devices, obtaining good performance requires producing an optical separation device of the pixels, arranged above the emitting and/or receiving face of the pixels. Such an optical separation element of the pixels, named a collimating grid or optical separation grid, makes it possible to prevent interference between neighbouring pixels (cross talk) and can also improve the light emission directivity. In addition, this optical separation grid can also be used to arrange on the pixels wavelength converting elements of a radiation intended to be emitted and/or received by the pixels, making it possible for example to change the colour emitted or to filter a light received. In the case of a photo-emitting device, such a converting element includes for example phosphorus. When the height of this element is substantial, the optical separation grid is therefore used to optically insulate the pixels from one another.

Generally, the optical separation grid is added above pixels after the production thereof. In order to not limit the useful surface of the pixels and obtain good performance, the walls that form the optical separation grid are made as finely as possible, for example with a width, or thickness, less than about 5 µm for pixels that each have a useful surface of which the sides have a dimension (width) equal to about 40 µm, and with a substantial height, for example greater than about 10 µm. Such dimensions lead to the optical separation grid having a substantial aspect ratio (height/width ratio), for example greater than 2. Furthermore, good verticality, low roughness and good reflectivity of the walls make it possible to obtain an optical separation grid that does not disturb the reflection, diffraction and diffusion of the optical signals received and/or emitted by the pixels.

In the case of a device comprising diodes that carry out a photo-emission and/or a photo-reception from the front face thereof (face opposite that located on the side of the substrate whereon the diodes are produced), such an optical separation grid can be produced during the manufacturing of the interconnection levels, also named BEOL ("Back-End Of Line"), of the device. One of these interconnection levels, formed on the side of the front face of the diodes, can be dedicated to the production of the optical separation grid. This configuration makes it possible to obtain a high degree of integration, and therefore a small size, as well as a good alignment of the optical separation grid with the pixels. However, this configuration cannot be applied to a device that carries out an emission and/or a reception of light from the rear face of the diodes because the interconnection levels are produced on the front face of the device. In addition, the height of the optical separation grid thus obtained is limited by the techniques implemented for producing the interconnection levels, with this height being generally between about 1 µm and 3 µm.

In the case of a device carrying out an emission and/or a reception of light from the rear face thereof, the optical separation grid is therefore produced by a specific method implemented after the production of the interconnection levels, the transfer of the device onto a support and the removal of the substrate from which the device is produced. The removal of the substrate releases the rear face of the diodes whereon the optical separation grid is produced. The main problem to be managed is in this case the alignment of the optical separation grid with the pixels.

In addition, when the collimating grid is produced by a deposition of material in trenches formed beforehand by lithography, it is necessary to planarize the material deposited.

DISCLOSURE OF THE INVENTION

Thus there is a need to propose a method for producing a photo-emitting and/or photo-receiving device with an optical separation grid that can be applied to a device carrying out an emission and/or a reception of light from the rear face thereof, which makes it possible to obtain a good alignment of the optical separation grid with one or more photo-emitting and/or photo-receiving components of the device, and which does not require the implementation of a planarization of a deposited material in order to form the optical separation grid.

For this, one embodiment proposes a method for producing a photo-emitting and/or photo-receiving device with a metal optical separation grid, comprising at least:

producing at least one photo-emitting and/or photo-receiving component, wherein at least one first metal electrode of the photo-emitting and/or photo-receiving component covers, or is arranged against, side flanks of at least one semiconductor stack of the photo-emitting and/or photo-receiving component and extends to at least one emitting and/or receiving face of the photo-emitting and/or photo-receiving component;

treating at least one face of the first metal electrode located at the emitting and/or receiving face, rendering wettable said face of the first metal electrode;

producing of the metal optical separation grid on at least one support;

fastening of the metal optical separation grid against said face of the first metal electrode by brazing;

removing the support.

This method proposes to transfer and fasten a metal optical separation grid by brazing by using one of the electrodes of at least one component of the device to define the contact zones whereon the optical separation grid is transferred and fastened, with these contact zones being made apt beforehand for brazing, i.e. wettable.

Using brazing to fasten the optical separation grid makes it possible to perfectly align the optical separation grid with regards to the photo-emitting and/or photo-receiving component or components of the device, thanks to the self-aligning effect that occurs when the brazing material used is in a molten state and the alignment takes place naturally via capillarity between the metal optical separation grid and the face of the first metal electrode.

Because the optical separation grid is produced beforehand on a support independently of the photo-emitting and/or photo-receiving component or components, no step of material planarization is required, contrary to an optical separation grid produced by deposition of material in trenches formed by lithography, prior to the production of components.

Furthermore, this method requires implementing few steps, with few constraints, and without any complex alignment.

This method can be implemented to produce colour LED matrices or of the RGB or monochrome type with a very good contrast, such as for example LED matrix headlamps for automobile.

A material or a surface is qualified as wettable when a drop of liquid, in the present case liquid brazing, located on this material or on this surface forms a contact angle less than 90°.

The metal optical separation grid is fastened against said face of the first metal electrode on the side opposite the one where the support is located.

The photo-emitting and/or photo-receiving component may include at least one photo-emitting and/or photo-receiving diode comprising at least:

first and second portions of doped semiconductors that are part of the semiconductor stack and which form a p-n junction, a first part of the first portion of doped semiconductor being arranged between a second part of the first portion of doped semiconductor and the second portion of doped semiconductor;

dielectric portions covering, or arranged against, side flanks of the first part of the first portion of doped semiconductor and side flanks of the second portion of doped semiconductor;

a second electrode electrically coupled to the second portion of doped semiconductor and such that the second portion of doped semiconductor is arranged between the second electrode and the first portion of doped semiconductor;

and wherein the first metal electrode is arranged against outer side flanks of the dielectric portions and against side flanks of the second part of the first portion of doped semiconductor such that the first metal electrode is electrically coupled to the first portion of doped semiconductor and electrically insulated from the second portion of doped semiconductor.

The outer side flanks of the dielectric portions correspond to the side flanks opposite those arranged against the first part of the first portion and against the second portion.

The method may further include, between the production of the photo-emitting and/or photo-receiving component and the treatment of the face of the first metal electrode, or after the removing of the support, an electrical and mechanical coupling of the photo-emitting and/or photo-receiving component, on the side opposite the emitting and/or receiving face, to at least one electronic control circuit.

The treatment of the face of the first metal electrode may include a deposition of at least one wettable material on the face of the first metal electrode, or, when the first metal electrode includes at least one first wettable metal material covered by at least one second non-wettable material, an etching of the second non-wettable material present on the face of the first metal electrode. This etching of the second non-wettable material renders the first wettable metal material accessible which then forms the face of the first metal electrode whereon the metal optical separation grid is fastened by brazing.

The method may further include, between the producing of the metal optical separation grid and the fastening of the metal optical separation grid, the deposition of at least one brazing material on the metal optical separation grid. This brazing material corresponds to the one used for the brazing of the metal optical separation grid on the face of the first metal electrode. Alternatively, the brazing material may be deposited not on the optical separation grid but on the first electrode. According to another alternative, it is possible to deposit a first brazing material on the optical separation grid and a second brazing material on the first electrode.

The metal optical separation grid may be produced on the support with at least one sacrificial layer arranged between the metal optical separation grid and the support, and the removing of the support may be produced by suppressing the sacrificial layer.

The method may be such that:

the metal optical separation grid is produced on the support with at least one temporary adhesive layer arranged between the metal optical separation grid and the support;

the temporary adhesive layer includes at least one material of which the adhesive properties are able to be degraded when said material is exposed to electromagnetic radiation, for example UV or infrared, and the removing of the support includes at least one exposure of the temporary adhesive layer to the electromagnetic radiation through the support.

BRIEF DESCRIPTION OF THE DRAWINGS

The present invention shall be better understood when reading the description of embodiments given solely for the purposes of information and in no way limiting in reference to the accompanying drawings wherein.

Identical, similar or equivalent parts of the different figures described hereinafter bear the same numerical references so as to facilitate passing from one figure to another.

The different parts shown in the figures are not necessarily shown according to a uniform scale, in order to render the figures more legible.

The different possibilities (alternatives and embodiments) must be understood as not being exclusive of one another and can be combined together.

DETAILED DISCLOSURE OF PARTICULAR EMBODIMENT

FIGS. 1 to 21 described hereinbelow show the steps of a method for producing a photo-emitting and/or photo-receiving device 100 according to a first embodiment.

In a first step, at least one photo-emitting and/or photo-receiving component 102 of the device 100 is produced. In the first embodiment described here, several photo-emitting and/or photo-receiving components 102 are produced and arranged next to one another by forming a matrix.

In the particular example implementation shown in FIGS. 1 to 21, the device 100 produced corresponds to an emitting device and the components 102 correspond to LEDs arranged in a matrix. Alternatively, the device 100 may correspond to a photo-receiving device wherein the components 102 correspond for example to photodiodes. According to another alternative, the device 100 may be both photo-emitting and photo-receiving and include a matrix that comprises both photo-emitting components 102 such as LEDs and photo-receiving components 102 such as photodiodes.

Figure 1:
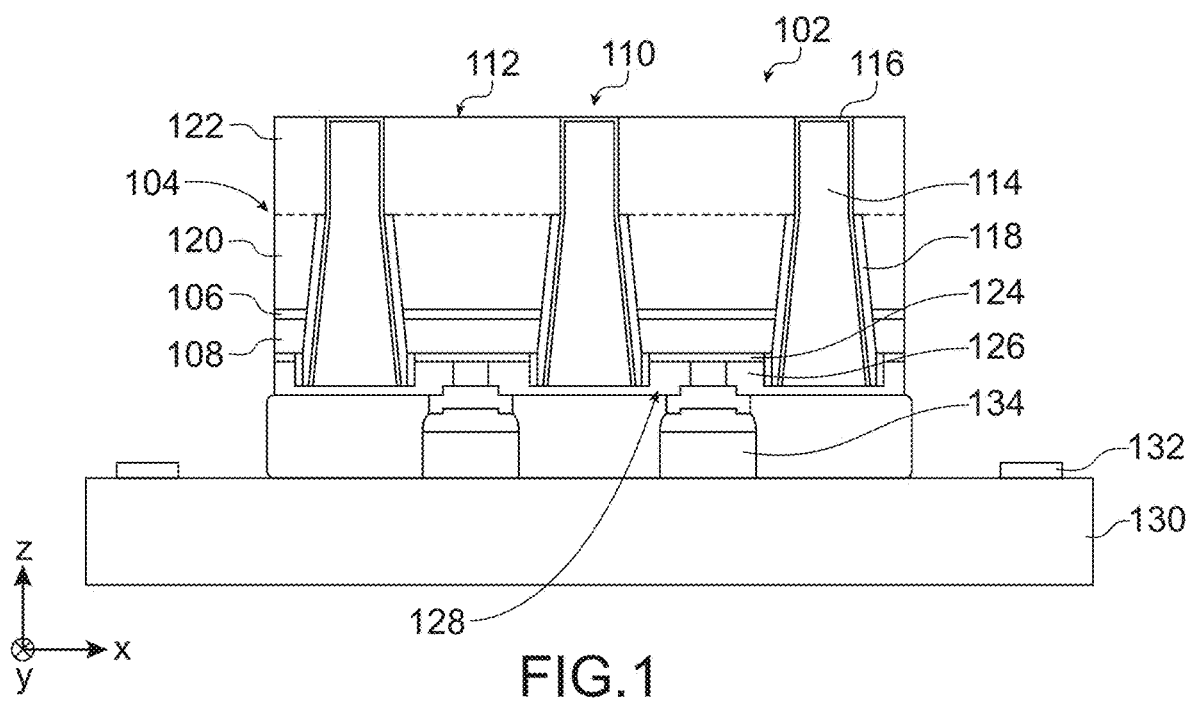
FIGS. 1 to 21 show the steps of a method for producing a photo-emitting and/or photo-receiving device with a metal optical separation grid according to a first embodiment.
Figure 2:
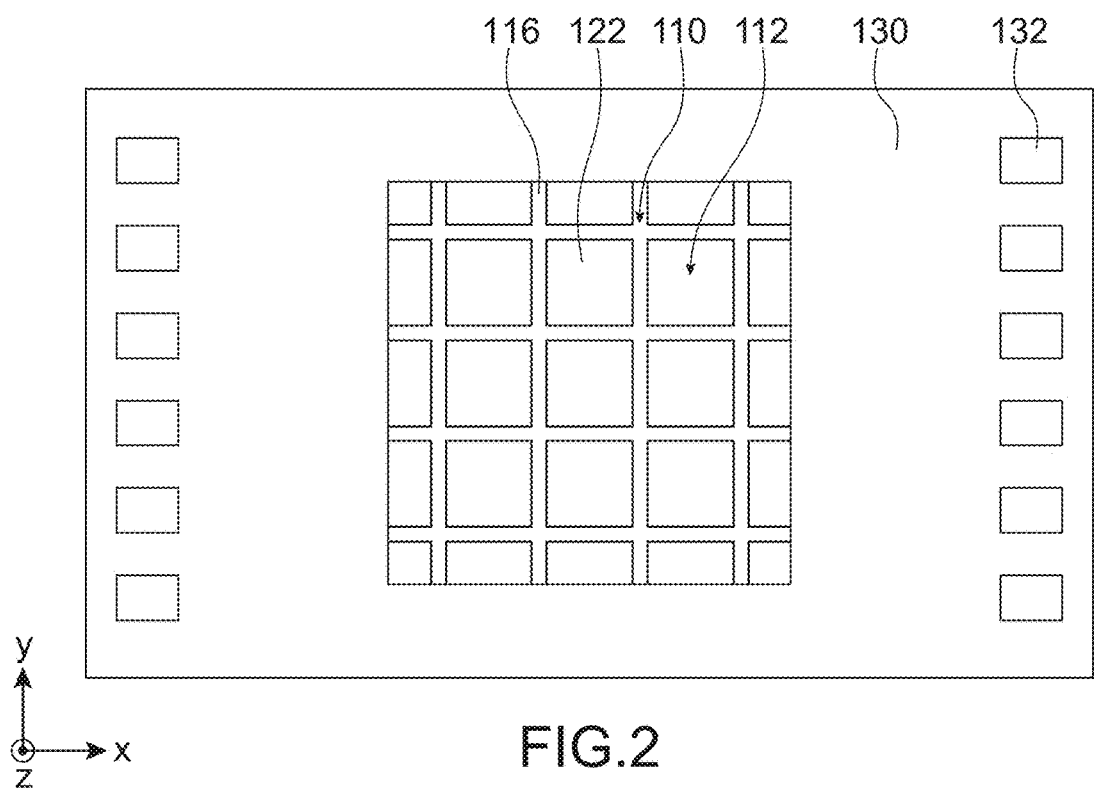

FIG. 1 shows a cross-section view of several components 102, and FIG. 2 shows a top view of these components 102.

Each component 102 includes a first portion 104 of doped semiconductor according to a first type of conductivity, for example of the n type. The thickness of the first portion 104 corresponds to its dimension which is perpendicular to the face of the support whereon the first portion 104 is arranged and is parallel to the axis Z shown in FIG. 1. The thickness of the first portion 104 is for example between about 20 nm and 10 µm, and preferably between about 2 µm and 4 µm.

According to a first example implementation, the first portion 104 includes a single doped semiconductor, for example n-doped with a concentration of donors for example between about $10^{17}$ and $5 \cdot 10^{20}$ donors/cm$^3$, and corresponding for example to GaN.

According to a second example implementation, the first portion 104 is formed from a stack of several different semiconductors, for example first doped semiconductor n+ with a concentration of donors for example between about $5 \cdot 10^{17}$ and $5 \cdot 10^{20}$ donors/cm$^3$ and a second doped semiconductor n− with a concentration of donors for example between about $10^{17}$ and $5 \cdot 10^{19}$ donors/cm$^3$. The first semiconductor is for example GaN and the second semiconductor is for example InGaN. The thickness of the first semiconductor may be greater than about 100 nm, for example equal to about 3 µm, and that of the second semiconductor is for example between about 5 nm and 500 nm. Alternatively, the different semiconductors of the first portion 104 may be doped with the same doping level.

In the particular example implementation described here wherein the components 102 correspond to LEDs, each component 102 also includes an emitting region 106 that comprises one or more emitting layers, for example five, intended for each forming a quantum well, comprising for example InGaN, and each one arranged between two barrier layers comprising for example GaN. The emitting layer or layers include intrinsic semiconductor materials, i.e. not intentionally doped (with a concentration of residual donors $n_{nid}$ for example equal to about $10^{17}$ donors/cm$^3$, or between about $10^{15}$ and $10^{18}$ donors/cm$^3$). The thickness (dimension along the axis Z) of the or of each one of the emitting layers is for example equal to about 3 nm and more generally between about 0.5 nm and 10 nm, and the thickness (dimension along the axis Z) of each one of the barrier layers is for example between about 1 nm and 25 nm.

Alternatively, it is possible that the components 102 do not include the emitting regions 106.

Each component 102 also includes a second portion 108 of doped semiconductor according to a second type of conductivity, opposite that of the doping of the first portion 104 and here of the p type, with a concentration in acceptors for example between about $10^{17}$ and $5 \cdot 10^{19}$ acceptors/cm$^3$. The semiconductor of the second portion 108 is for example GaN and its thickness (dimension along the axis Z) is for example between about 20 nm and 10 µm.

The emitting region 106 is arranged between the first portion 104 and the second portion 108.

The portions 104 and 108 form p-n junctions of the components 102. The portions 104, 108 and the emitting region 106 together form a p-i-n junction.

Alternatively, the conductivity types of the semiconductors of the portions 104 and 108 may be inverted with respect to the example described here.

In an alternative implementation, an electron-blocking layer (not shown in FIGS. 1 to 21) may be arranged between the second portion 108 and the emitting region 106, with this electron-blocking layer comprising for example AlGaN with 12% aluminium and p-doped with a concentration of acceptors for example equal to about $10^{17}$ acceptors/cm$^3$.

Materials other than those mentioned hereinabove may be used to produce the portions 104, 108 and the emitting region 106.

In each component 102, the portions 104, 108 and the emitting region 106 form a stack of semiconductors corresponding to a mesa structure. The expression "mesa structure" designates the fact that the component 102 is produced in the form of a stack of portions 104, 108 of doped semiconductors, with a junction zone being formed at the interface of these two portions 104, 108 of doped semiconductors, and that this stack is here etched over the entire height thereof in the form of an island named mesa.

The dimensions of the sides (dimensions in the plane (X,Y)) of one of the structures mesa formed by the components 102 may be between about 500 nm and 1 mm, or between 500 nm and several millimetres, according to the target applications and the desired pixel density. For example, for applications that make use of high-power diodes (for example LED matrices for vehicle headlamps), the dimensions of the diodes are more substantial (a few tens of microns) than in applications that make use of diodes with a lower power, such as for example the field of screens (generally less than about ten microns).

Each component 102 includes a first electrode 110 covering, or arranged against, side flanks of a semiconductor stack of the component 102 formed by the portions 104, 108 and the emitting region 106, and extending over the entire height of the structures mesa formed by the component 102 to an emitting and/or receiving face 112 of the component 102. The first electrode 110 corresponds for example to the cathode of the component 102. The first electrode 110 here includes a central part 114 comprising for example copper, and an outer layer 116 that covers the central part 114 and comprising for example titanium of a thickness for example between about 5 nm and 300 nm and aluminium of a thickness for example between about 50 nm and 1 µm. Advantageously, the thickness of the outer layer 116 is equal to about 400 nm.

The width of the first electrode 110, corresponding to the dimension along the axis X shown in FIG. 1, is less than the dimension of a side of a component 102 in the plane (X,Y) and is for example between about 1 µm and 20 µm, or between about 3 µm and 6 µm, and for example equal to about 5 µm.

In the first embodiment described here, the first electrodes 110 are electrically coupled together to form a common electrode (for example a cathode) with several components 102 of the device 100. The first electrodes 110 together form a grid of which the portions surround the semiconductor stacks of these components 102.

In the device 100, the first electrodes 110 are also used to optically insulate the components 102 from one another. The outer layer 116, in particular when it includes aluminium, makes it possible in particular to have good optical reflection on the side flanks of the structures mesa and therefore limits the cross talk between neighbouring components 102.

Each component 102 also includes dielectric portions 118 that cover side flanks of a first part 120 of the first portion 104, side flanks of the emitting region 106 and side flanks of the second portion 108. The dielectric portions 118 include for example a $SiN/SiO_2$ bilayer, and have for example a thickness, or width, between about 3 nm and 2 µm and for example equal to about 200 nm. These dielectric portions 118 provide the electrical insulation between the first electrode 110 and the second portion 108, and between the first electrode 110 and the emitting region 106.

The dielectric portions 118 do not cover the side flanks of a second part 122 of the first portion 104 (the first part 120 being arranged between the second part 122 and the second portion 108). Thus, the first electrode 110 is in contact electrically with the second part 122 of the first portion 104. In FIGS. 1 to 21, the first and second parts 120, 122 of the first portion 104 are symbolically delimited from one another by a dotted line.

Each component 102 also includes a second electrode 124, corresponding for example to the anode, electrically connected to the second portion 108 and such that the second portion 108 is arranged between the second electrode 124 and the first portion 104. The second electrode 124 includes for example an optically reflective material such as aluminium, or silver. This material is qualified as optically reflective because it has a reflection coefficient in amplitude (ratio of the amplitude of the reflected light over the amplitude of the incident light) of at least 80%.

The distance between two neighbouring components 102, i.e. the sum of the thickness of a portion of the first electrode 110 and of the thicknesses of two dielectric portions 118, is for example greater than or equal to about 0.5 µm.

Each component 102 also includes dielectric portions 126 that provide the electrical insulation between the first electrode 110 and the second electrode 124.

The components 102 include the electrodes 110, 124 thereof accessible from a rear face 128 opposite the emitting region 112.

The components 102 are transferred, at the rear face 128 thereof, onto an electronic control circuit 130 to which the electrodes 110, 124 of the components 102 are electrically coupled. This transfer makes it possible to electrically and mechanically couple the components 102 to the circuit 130. The circuit 130 includes a substrate whereon active addressing components for example of the CMOS or passive type (interconnect network) are in particular produced. Electrically-conductive pads 132 make it possible to electrically access the components of the circuit 130 from the outside of the device 100. The transfer of the components 102 on the electronic control circuit 130 is carried out by hybridisation, for example by brazing or direct gluing between contact pads of the circuit 130 and contact pads 134 formed between the components 102 and the circuit 130. The contact pads include for example copper.

Details on the production of components 102 are described in document WO 2017/068029 A1.

After the production of the components 102, a treatment of the face of the first electrodes 110 located on the side of the emitting face 112 is implemented in order to render this face of the first electrodes 110 wettable. Indeed, the material present on the surface of the first electrodes 110, corresponding here to the metal of the outer layer 116, is not generally wettable, as is the case with aluminium, or not sufficiently wettable.

Figure 3:
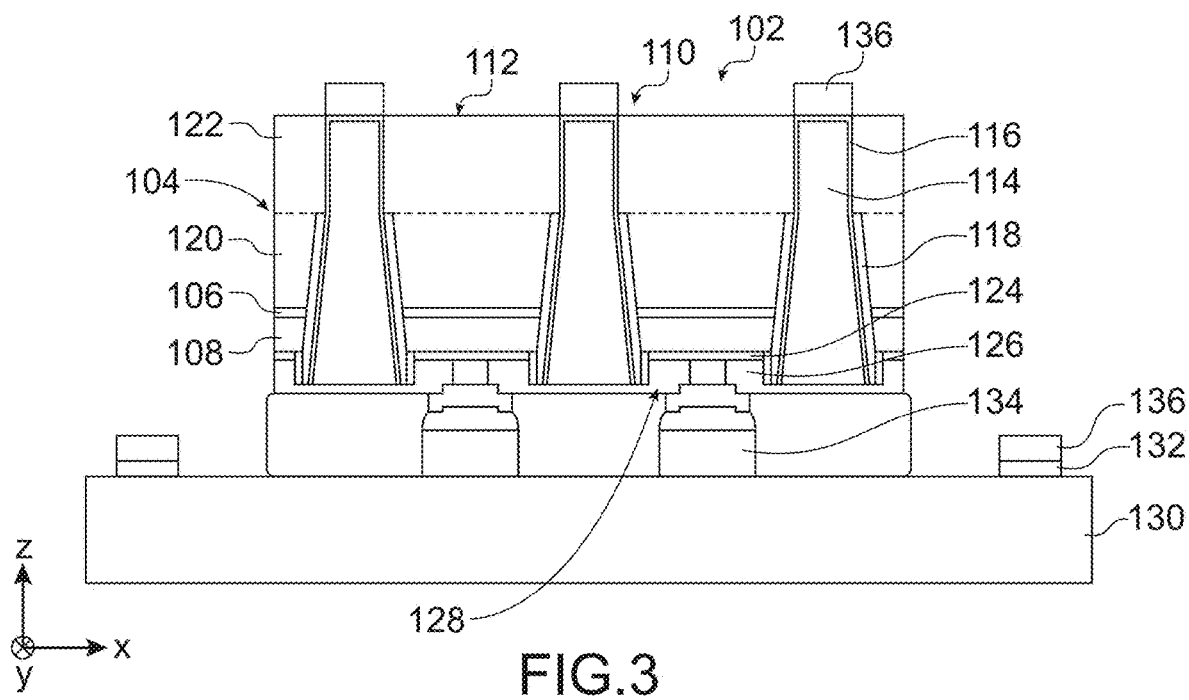
Figure 4:
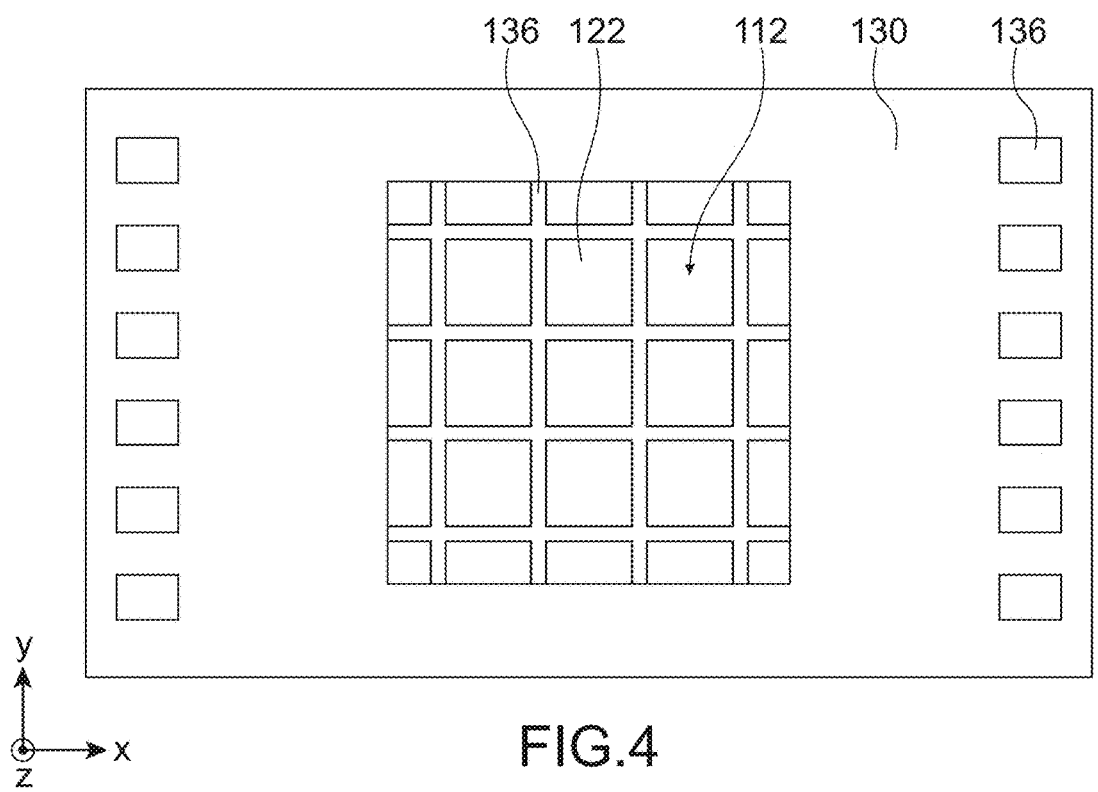

According to a first example, this treatment includes a deposition of at least one wettable material on the treated face of the first electrode 110, i.e. on the face of the first electrode 110 whereon an optical separation grid 140 is intended for being produced. The wettable material corresponds for example to a bilayer of the Ni/Au type. The wettable material is for example deposited by a so-named "electroless" deposition, i.e. which does not make use of an electric current to provide the deposition of the material. Alternatively, it is possible to carry out the deposition of a wettable material corresponding to a Ti/Ni/Au multilayer for example by a technique referred to as "lift off" or any other method that uses conventional methods of metal deposition and photolithography. The structure obtained at the end of such a treatment according to this first example is shown in FIGS. 3 and 4, with the reference 136 designating the portions of the wettable material deposited onto the first electrodes 110 (in these figures, the wettable material is also deposited on the pads 132).

Figure 5:
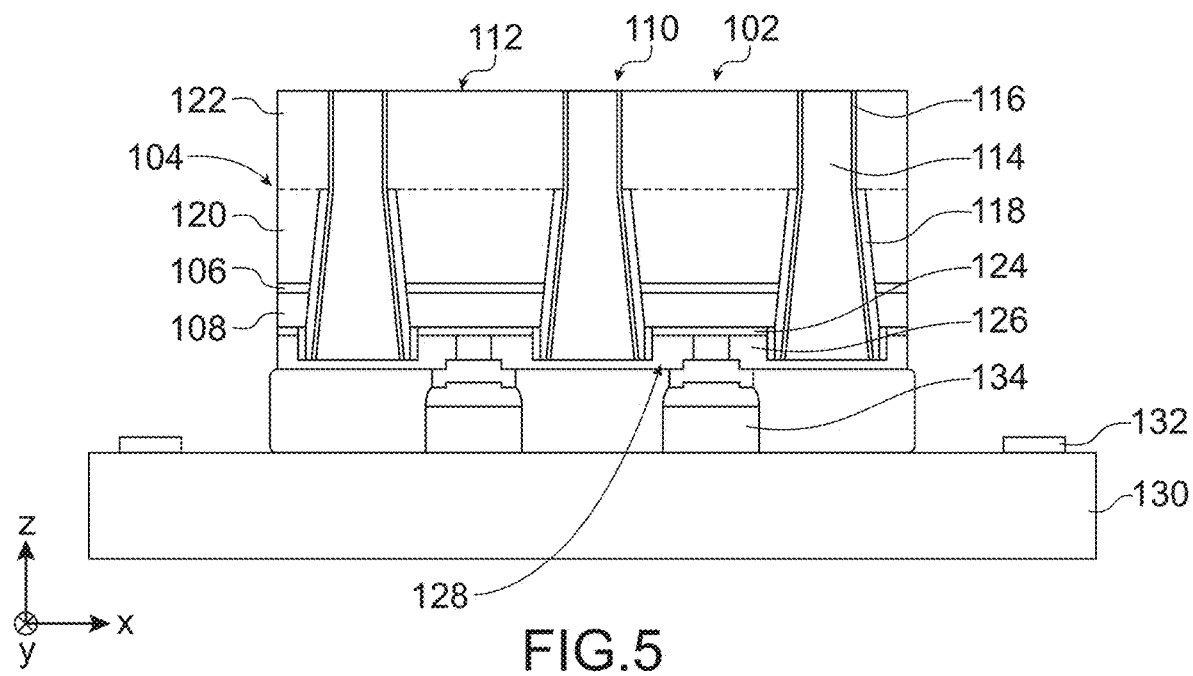
Figure 6:
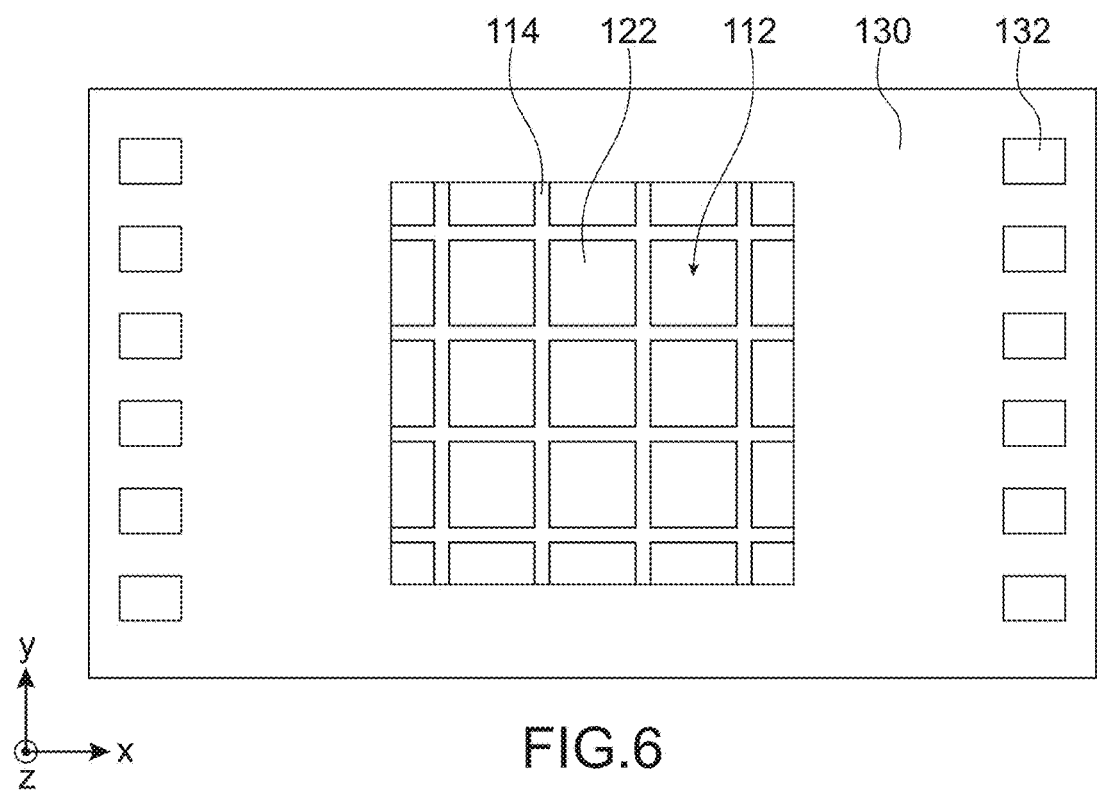

According to a second example, when the first electrode 110 includes a wettable material covered by a non-wettable material (as is the case here with the copper of the central part 114 which is covered by the titanium and the aluminium of the outer layer 116), the treatment may include an etching of the non-wettable material of the first electrode 110 in order to expose the wettable material of the first electrode 110. Such an etching is for example implemented by using a plasma, advantageously $SF_6$ and/or a chlorinated plasma, in order to suppress the metal or metals of the outer layer 116 of the first electrode 110. During this etching, the pads 132 are covered with protective resin so that they are not altered by this etching. This resin is then suppressed. Alternatively, it is possible to implement an ion beam etching. The structure obtained at the end of such a treatment is shown in FIGS. 5 and 6.

In parallel to the treatment of the first electrode 110, the metal optical separation grid 140 intended for being transferred onto the first electrode 110 is produced.

A first example implementation of the optical separation grid 140 is described hereinbelow in relation with FIGS. 7 to 10.

The optical separation grid 140 is produced from a support 142, which corresponds for example to a semiconductor substrate, here a silicon substrate. The support 142 corresponds here to a silicon wafer with a diameter equal to 200 mm.

A sacrificial layer 144 is formed on the face of the support 142 on the side of which the optical separation grid 140 is intended for being produced. The material of the sacrificial layer 144 is here able to be selectively etched with respect to the material of the optical separation grid 140. In the embodiment described here, the sacrificial layer 144 corresponds to a titanium layer. The thickness (dimension along the axis Z) of the sacrificial layer 144 is here equal to about 50 nm.

A metal growth layer 146, starting from which the material of the optical separation grid 140 will be deposited, is then formed on the sacrificial layer 144. In the embodiment described here, the growth layer 146 includes copper. The sacrificial layer 144 also serves as an anchoring layer for the deposition of the growth layer 146. The thickness (dimension along the axis Z) of the growth layer 146 is for example equal to about 100 nm.

Figure 7:
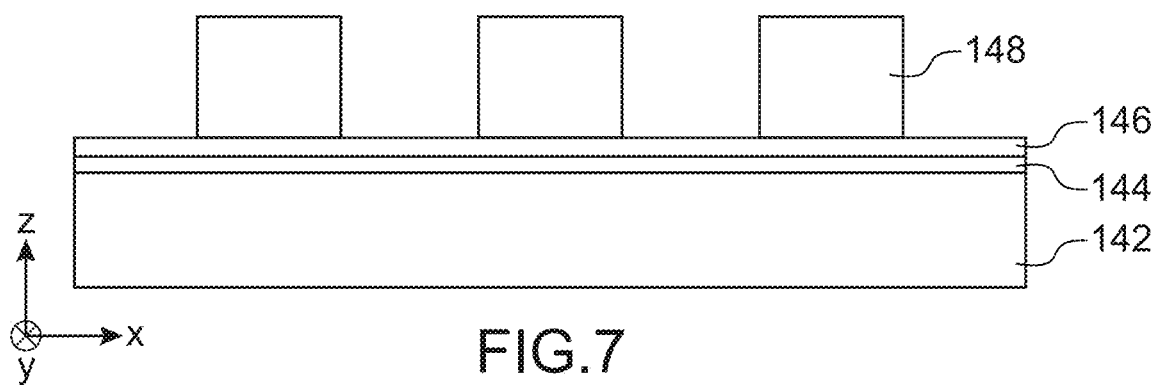

The desired pattern of the optical separation grid 140 is defined by a resin mask 148 deposited on the growth layer 146 (see FIG. 7). This pattern corresponds to that of the first electrode 110, i.e. here that of a grid.

The metal material of the optical separation grid 140, for example copper, is then deposited from portions of the growth layer 146 not covered by the mask 148. Such a deposition corresponds for example to an electrochemical deposition, or ECD growth.

The width of the portions of the optical separation grid 140 (dimension along the axis X shown in FIG. 8) is equal to or close to that of the first electrodes 110. The height of the optical separation grid 140 (dimension along the axis Z shown in FIG. 8) is for example between about 5µ and 50 µm, and advantageously between about 10 µm and 20 µm.

A brazing material 150 is then deposited on the metal material of the optical separation grid 140. This brazing material 150 includes for example at least one of the following materials: SnAg, In, Sn, SnCu, InSn. The brazing material 150 may be deposited directly after the grid 140 by the same ECD electrochemical deposition technique or afterwards by a deposition of the "lift-off", immersion, coating, screen-printing, etc. type. The thickness (dimension along the axis Z) of the brazing material 150 is for example between about 1 µm and 10 µm, and for example equal to about 3 µm.

Figure 8:
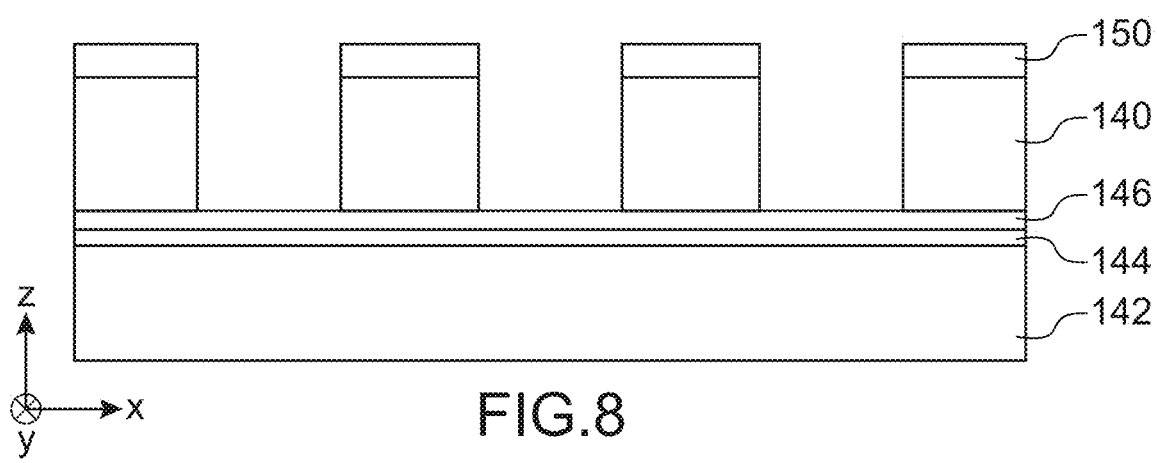
Figure 9:
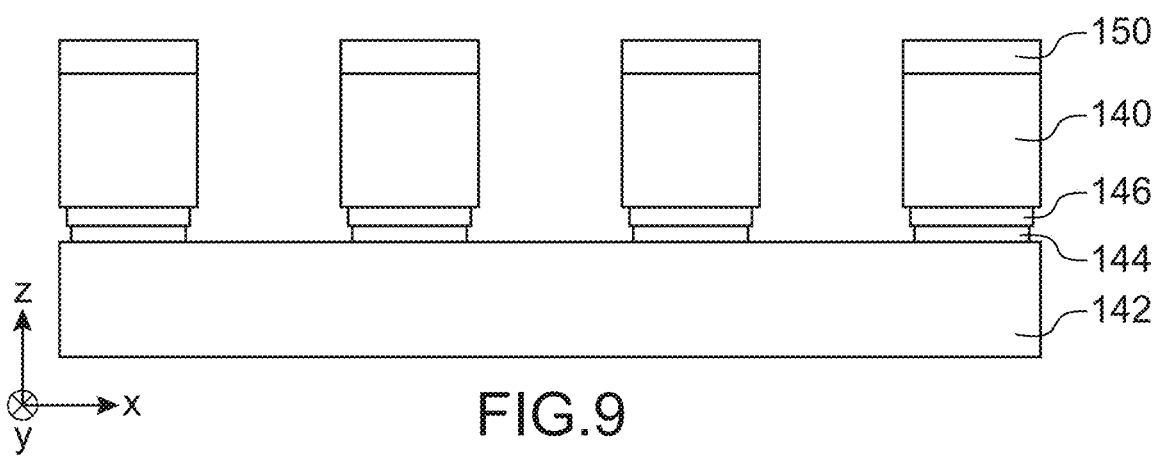

The mask 148 is then removed (see FIG. 8).

The parts of the growth layer 146 and of the sacrificial layer 144 that were covered by the mask 148 are then suppressed, for example by chemical etching.

Figure 10:
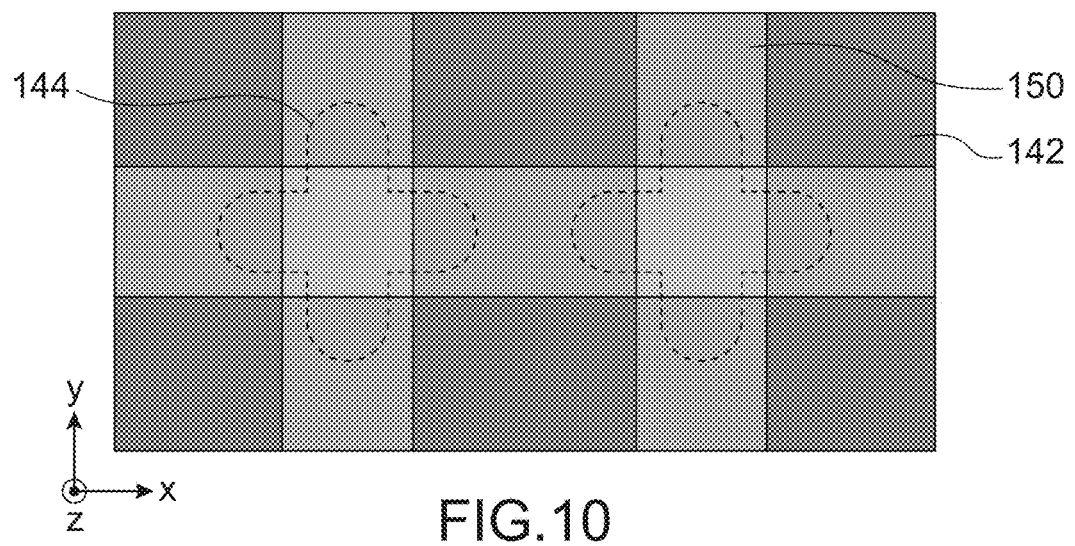

In order to facilitate the later removal of the support 142 with respect to the optical separation grid 140, a step of over-etching of the sacrificial layer 144 is then implemented. This over-etching of the sacrificial layer 144 suppresses parts of the sacrificial layer 144 present between the optical separation grid 140 and the support 142 so that the only remaining parts of the sacrificial layer 144 are located at the intersections formed by the optical separation grid 140, as can be seen in FIG. 10.

Figure 11:
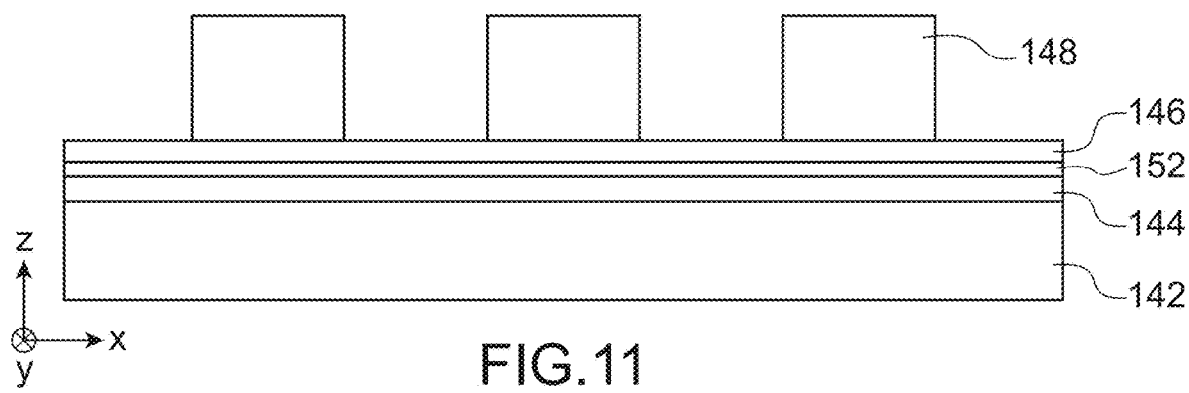
Figure 12:
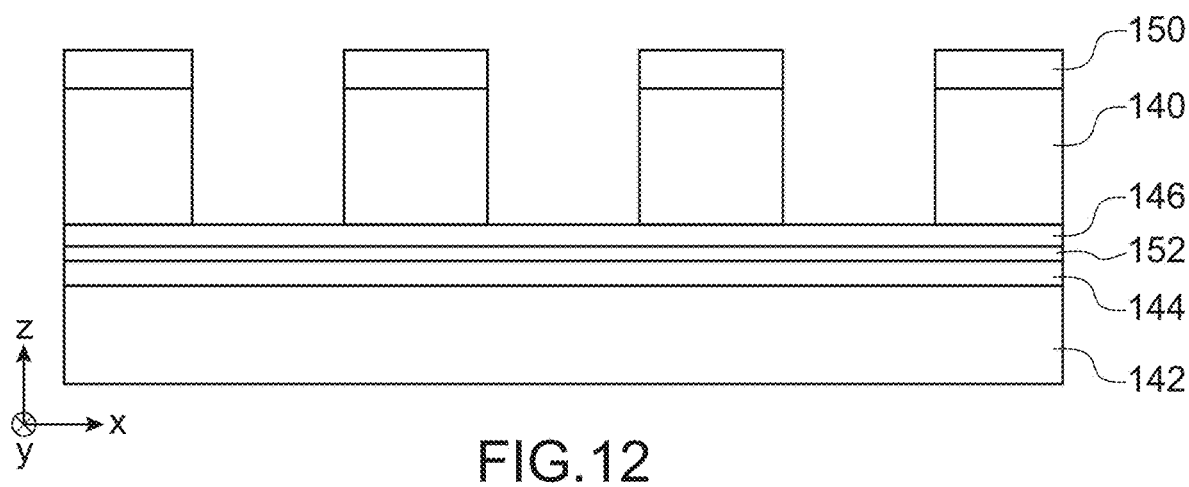

A second advantageous example implementation of the optical separation grid 140 is described hereinbelow in relation with FIGS. 11 to 13.

As in the first embodiment described hereinabove, the optical separation grid 140 is produced from the support 142 whereon the sacrificial layer 144 is produced. Contrary to the first example implementation wherein the sacrificial layer 144 corresponds to a layer of material that can be selectively etched and which also forms an anchoring layer for the metal growth layer 146, the sacrificial layer and anchoring layer functions are here fulfilled by two separate layers. In this second embodiment, the sacrificial layer 144 is arranged between the support 142 and the anchoring layer bearing the reference 152 in FIG. 11. The anchoring layer 152 is arranged between the sacrificial layer 144 and the metal growth layer 146 which is for example identical to that described hereinabove for the first embodiment.

The anchoring layer 152 corresponds for example to a titanium layer identical to the sacrificial layer described hereinabove in relation with the first example implementation.

The sacrificial layer 144 of this second example implementation may be produced according to several alternatives.

According to a first alternative, the sacrificial layer 144 may include a material able to be dissolved in a solvent. Such a material corresponds for example to a temporary adhesive resin for example marketed by the company Brewer Science and of the BrewerBOND® 220 or 305 type and which is soluble in a limonene solution.

According to a second alternative, the sacrificial layer 144 may include polyimide. The polyimide is a polymer marketed for example by the company HD MicroSystems of reference PI-2610, having a thickness for example between 1 µm and 2.5 µm and for example equal to about 2 µm and which can be removed par an oxygen plasma, or of reference PI-2611 of which the thickness is for example between 3 µm and 9 µm. The polymer has for example here a coefficient of thermal expansion, or CTE, close to that of silicon.

The optical separation grid 140 is produced as described hereinabove for the first example implementation, i.e. be depositing the resin mask 148 on the growth layer 146 (see FIG. 11), then by depositing the metal material of the optical separation grid 140 starting from portions of the growth layer 146 not covered by the mask 148, by forming the brazing material 150 on the optical separation grid 140 and by removing the mask 148 (see FIG. 12).

Figure 13:
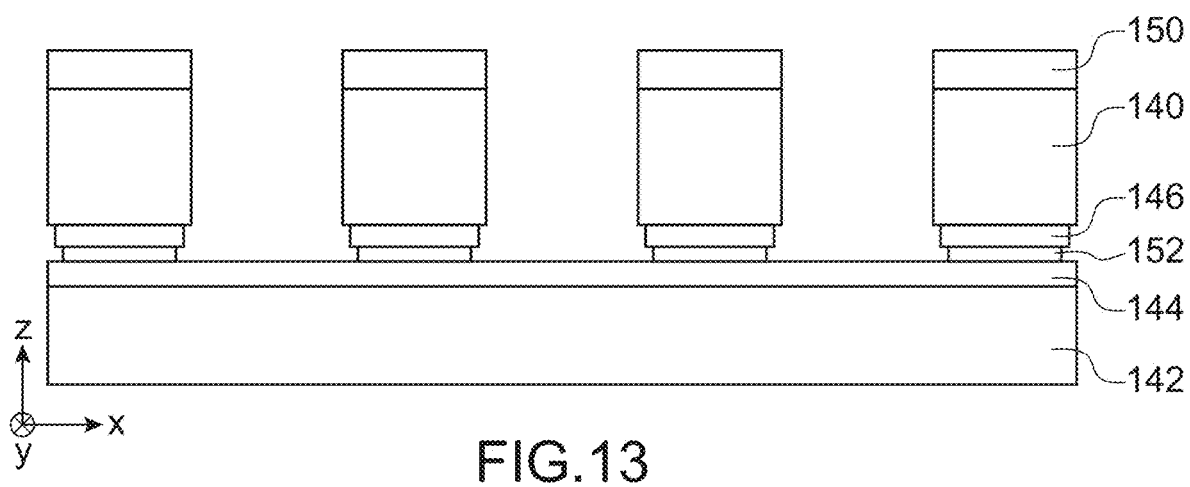

The parts of the growth layer 146 and of the anchoring layer 152 that were covered by the mask 148 are then suppressed, for example by chemical etching (see FIG. 13).

Figure 14:
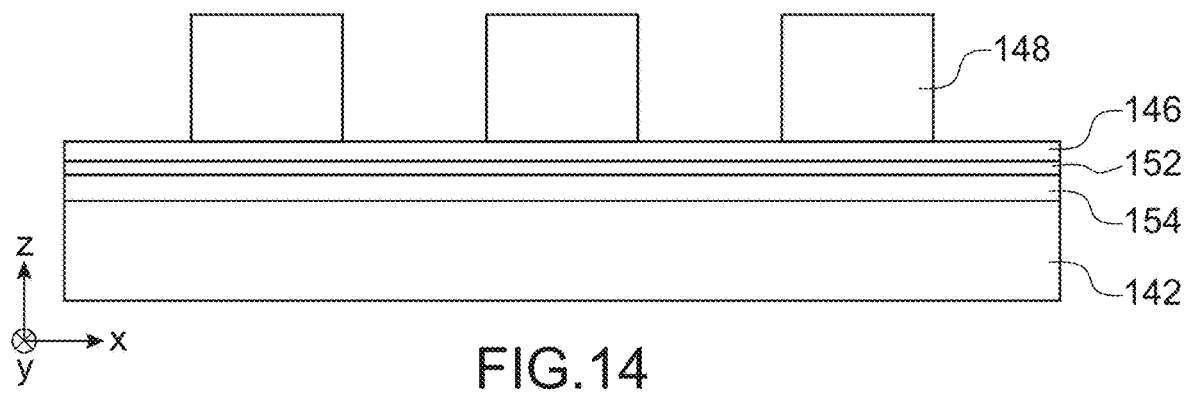
Figure 15:
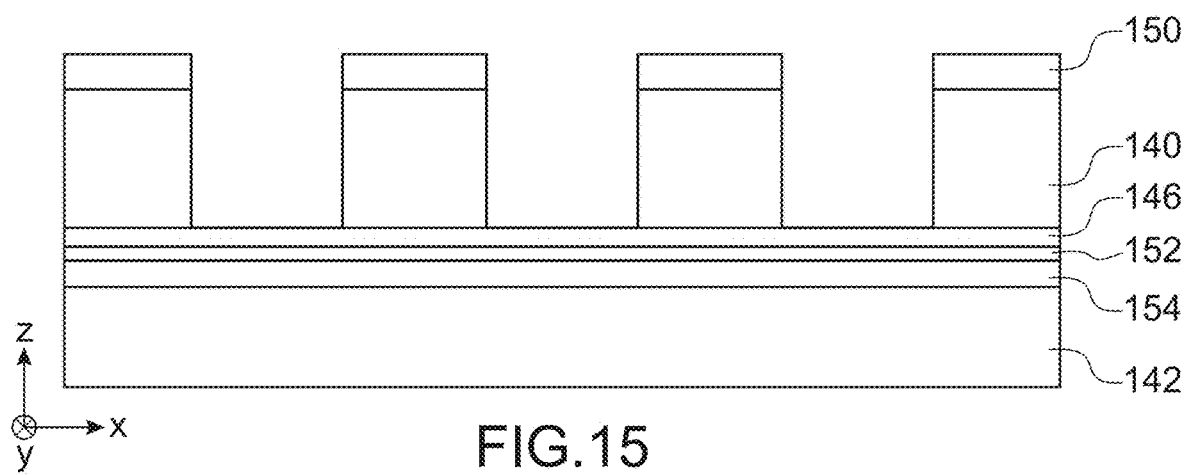

A third advantageous example implementation of the optical separation grid 140 is described hereinbelow in relation with FIGS. 14 to 16.

In this third example implementation, the support 142 is covered with a temporary adhesive layer 154. The anchoring layer 152 is produced on the temporary adhesive layer 154 and the growth layer 146 is produced on the anchoring layer 152. The anchoring layer 152 and the growth layer 146 are for example identical to those described hereinabove for the second embodiment of the optical separation grid 140.

The temporary adhesive layer 154 of this third example implementation may be produced according to several alternatives.

According to a first alternative, the temporary adhesive layer 154 includes an adhesive material of which the adhesive properties degrade at a given temperature. The temporary adhesive layer 154 is for example of the "Thermal Release Tape" type marketed for example by the company Nitto Denko Corporation and named Revalpha®, of which the adhesive properties degrade at a temperature greater than or equal to for example 170° C. The brazing which makes it possible to fasten the optical separation grid 140 to the first electrode 110 will in this case be implemented at a temperature that is greater than or equal to the melting temperature of the brazing material 150 used and also greater than or equal to the given temperature starting from which the adhesive properties of the temporary adhesive layer 154 degrade. During the brazing, a fast rise in temperature makes it possible to reach the melting of the brazing material 150 used before the complete detaching of the temporary adhesive layer 154. At the end of the brazing, the adhesive properties of the temporary adhesive layer 154 are zero or almost zero and the support 142 can then be separated from the optical separation grid 140. Where applicable, if the detaching was not able to be carried out during the brazing operation, detaching can be carried out by another rise in temperature above which the adhesive properties of the temporary adhesive layer 154 degrade. In such an alternative, the brazing material 150 advantageously includes a low melting temperature and corresponds for example to Sn—Ag, In, InSn or pure Sn. However, thanks to the gluing energy, other brazing materials 150 may be used.

According to a second alternative, the temporary adhesive layer 154 includes a material of which the adhesive properties degrade when said material is exposed to electromagnetic radiation. Such a material corresponds for example to LTHC (Light to Heat Conversion Coating) marketed by the company 3M® of which the adhesive properties degrade with an IR radiation obtained with a YAG laser, or is of the BrewerBOND® 701 type marketed by the company Brewer Science, or of the HD-3007 type marketed by the company HD Microsystems of which the adhesive properties degrade with a UV radiation obtained for example with an excimer laser, or by using a solvent or by heating. In this case, the removing of the support 142 will include exposure of the temporary adhesive layer 154 to the radiation used through the support 142. In this alternative, the support 142 is therefore chosen such that it is transparent or at least partially transparent to the radiation used.

The optical separation grid 140 is then produced as described hereinabove for the first and second embodiments, i.e. by depositing the resin mask 148 on the growth layer 146 (see FIG. 14), then by depositing the metal material of the optical separation grid 140 starting from portions of the growth layer 146 not covered by the mask 148, by forming the brazing material 150 on the optical separation grid 140 and by removing the mask 148 (see FIG. 15).

Figure 16:
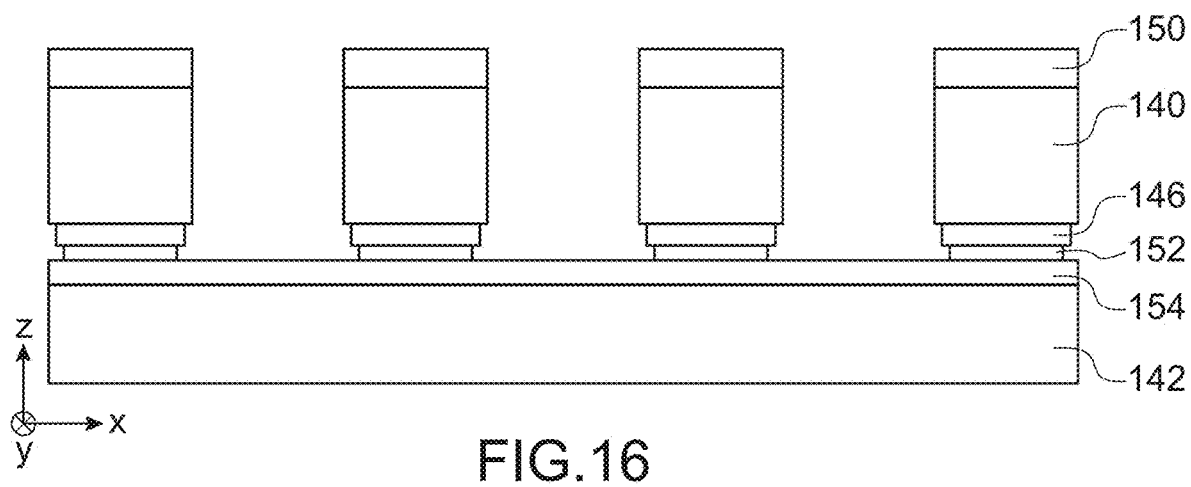

The parts of the growth layer 146 and of the anchoring layer 152 that were covered by the mask 148 are then suppressed, for example by chemical etching (see FIG. 16).

Figure 17:
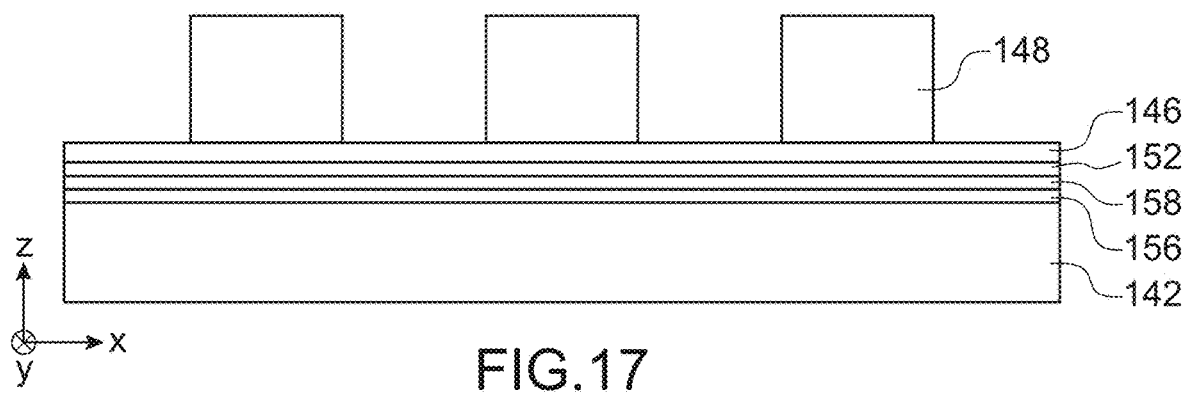
Figure 18:
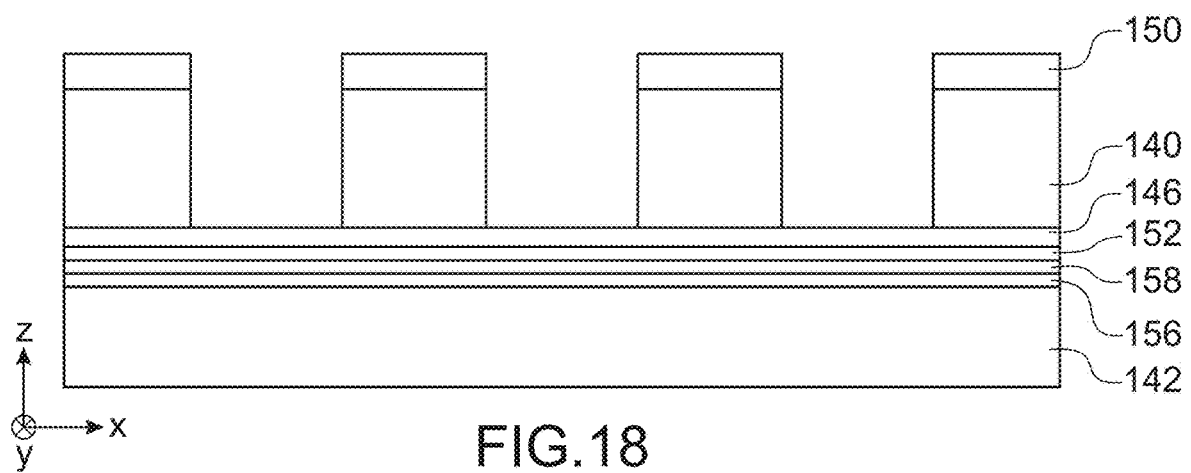

A fourth example implementation of the optical separation grid 140 is described hereinbelow in relation with FIGS. 17 to 19.

In this fourth example implementation, the support 142 is covered with an oxide layer 156 on which is then deposited a platinum layer 158. The anchoring layer 152 is produced on the platinum layer 158 and the growth layer 146 is produced on the anchoring layer 152. The anchoring layer 152 and the growth layer 146 are for example identical to those described hereinabove for the second and third example implementations of the optical separation grid 140.

The interface formed between the oxide layer 156 and the platinum layer 158 has a low adherence which will later make it possible to detach the support 142 with respect to the optical separation grid 140 by mechanically separating the oxide layer 156 with respect to the platinum layer 158.

The optical separation grid 140 is produced as described hereinabove for the preceding embodiments, i.e. by depositing the resin mask 148 on the growth layer 146 (see FIG. 17), then by depositing the metal material of the optical separation grid 140 starting from portions of the growth layer 146 not covered by the mask 148, by forming the brazing material 150 on the optical separation grid 140 and by removing the mask 148 (see FIG. 18).

Figure 19:
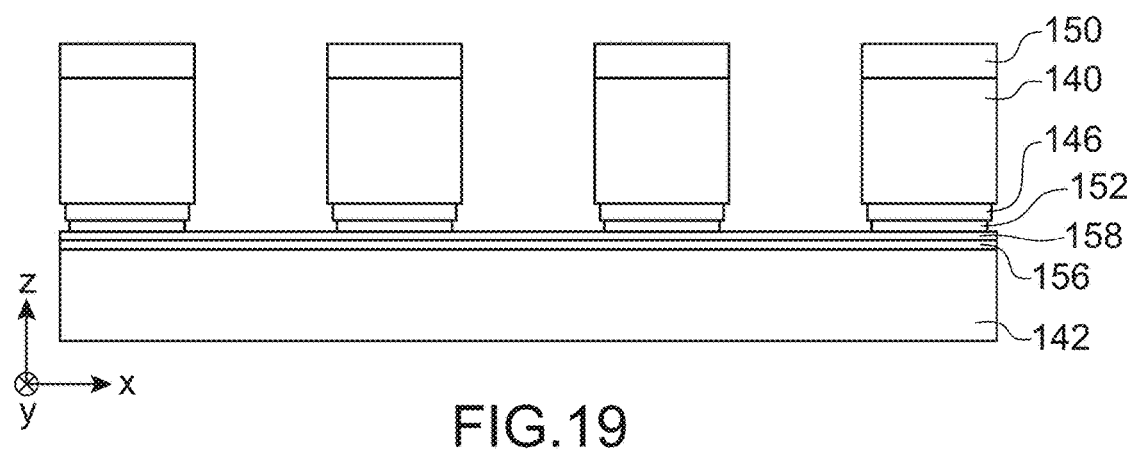

The parts of the growth layer 146 and of the anchoring layer 152 that were covered by the mask 148 are then suppressed, for example by chemical etching (see FIG. 19).

For the different example implementations of the optical separation grid 140 described hereinabove, it is possible to implement, between the steps of depositing the metal material of the optical separation grid 140 and the step of depositing the brazing material 150, a step of depositing a second material that in particular covers the side walls of the first metal material of the optical separation grid 140. This second material of the optical separation grid 140, covering the first material of the optical separation grid 140, is advantageously a metal material, for example silver that can be deposited by a so-named "electroless" deposition, or by spraying or PVD deposition, improving the reflectivity of the side walls of the optical separation grid 140 and protecting the first material from oxidation.

Figure 20:
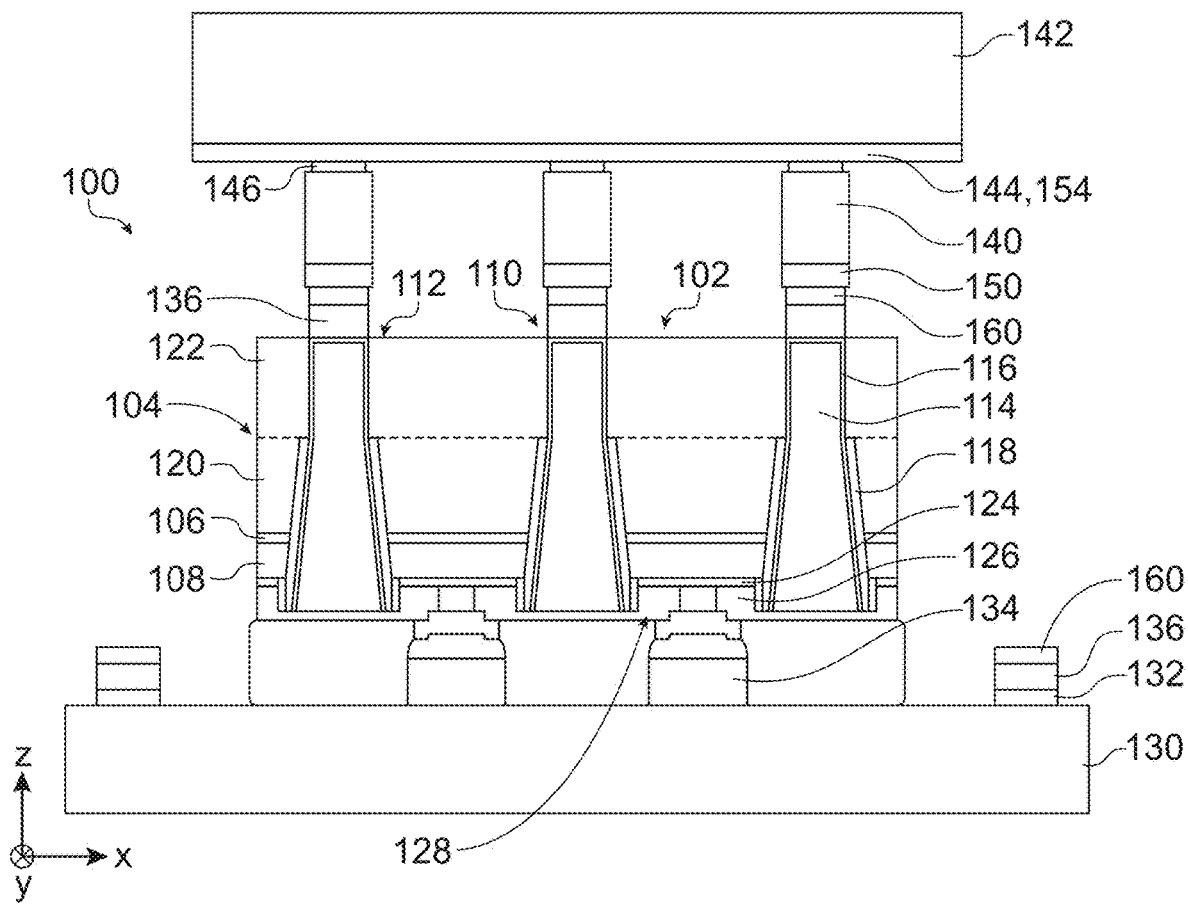

After having produced the optical separation grid 140, this grid 140 is fastened by brazing against the face of the first electrode 110 which has undergone beforehand the treatment that makes it wettable (see FIG. 20). This brazing is carried out through brazing material 150, at a temperature greater than the melting temperature of this brazing material 150, for example at about 250° C. It is possible that a brazing material 160 be deposited beforehand on the first electrode 110, as is the case in FIG. 20.

When the brazing material or materials used are in a molten state, a self-alignment is produced between the optical separation grid 140 and the metal portions of the first electrode 110.

Figure 21:
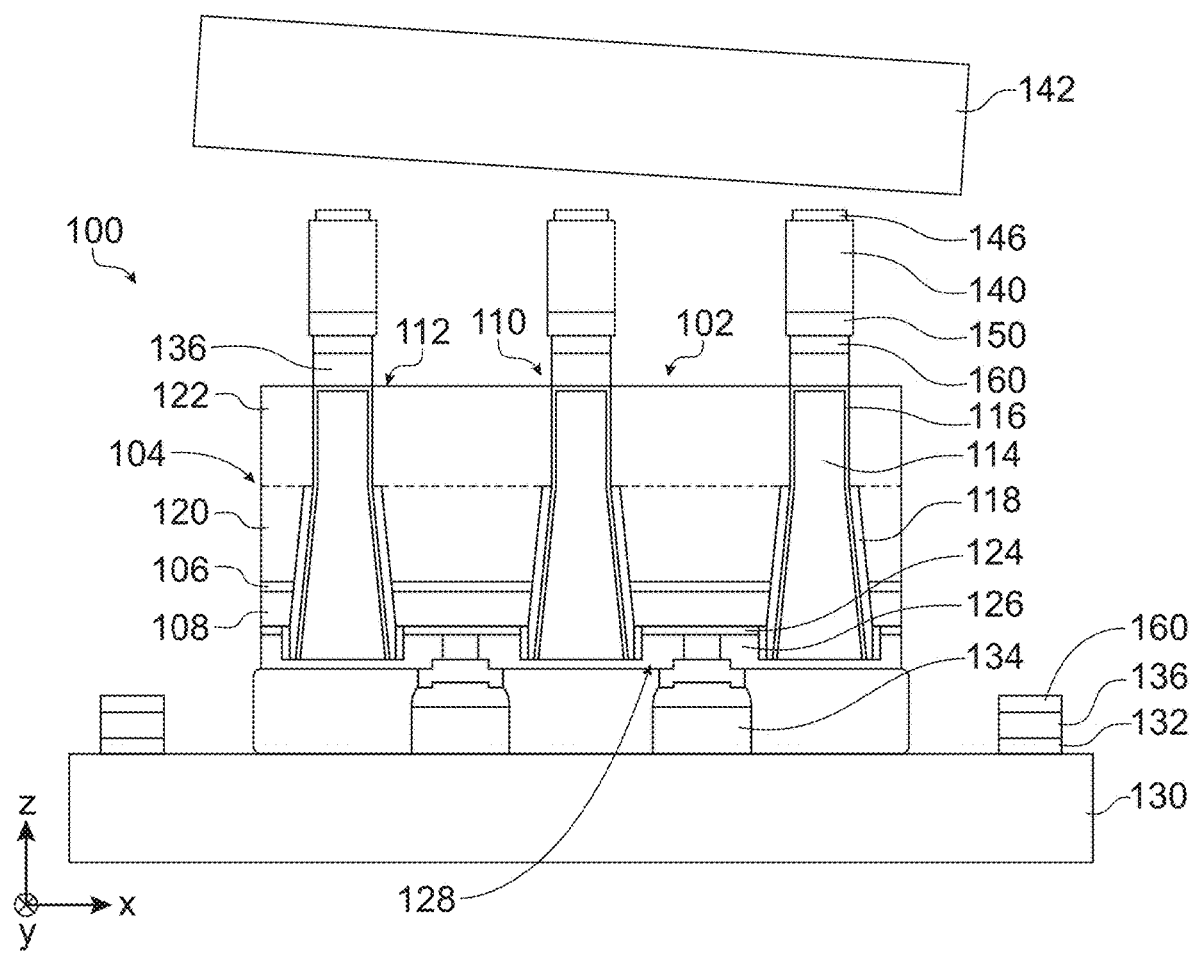

Finally, the support 142 is removed and detached from the optical separation grid 140, completing the production of the device 100 (see FIG. 21). The technique implemented to produce this removal depends on the nature of the layer or layers that form the interface between the support 142 and the optical separation grid 140:

- in the case of a sacrificial layer 144 such as described hereinabove in the first example implementation of the optical separation grid 140, a chemical etching is for example implemented to suppress the remaining portions of the sacrificial layer 144 located at the intersections formed by the optical separation grid 140;
- in the case of a sacrificial layer 144 comprising a material able to be dissolved in a solvent, the assembly produced may be immersed in a chemical solution that comprises this solvent, resulting in the dissolution of the sacrificial layer 144. It is in this case advantageous that the support 142 include holes forming accesses, for the solvent, to the sacrificial layer 144 from the face opposite that on which the sacrificial layer 144 is located;
- in the case of a sacrificial layer 144 comprising polyimide, the assembly produced may be subjected to a plasma that comprises for example oxygen, making it possible to etch the sacrificial layer 144. Here again, it is advantageous that the support 142 include holes forming accesses, for the plasma, to the sacrificial layer 144 from the face opposite that on which the sacrificial layer 144 is located;
- in the case of a temporary adhesive layer 154 including an adhesive material of which the adhesive properties degrade at a given temperature, the support 142 may be removed at the end of brazing due to the fact that the temperature reached during this brazing suppresses the adhesive properties of the temporary adhesive layer 154;

in the case of a temporary adhesive layer 154 including a material of which the adhesive properties degrade when said material is exposed to electromagnetic radiation (for example UV or IR), an exposure of this material to this radiation by laser is carried out through the support 142;

in the case of an interface formed by an oxide layer 156 and a platinum layer 158, a mechanical force applied to the interface of these layers makes it possible to separate them from one another. It is then suitable to etch the platinum layer 158 or then to have etched it beforehand following the etching operations as indicated hereinabove in relation with FIG. 19.

Figure 22:
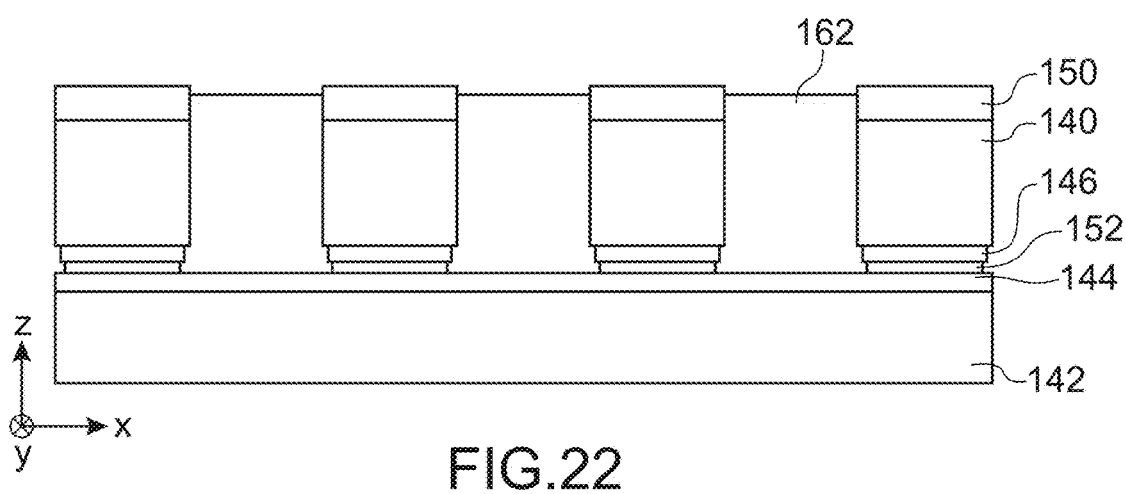
FIGS. 22 and 23 show steps of a method for producing a photo-emitting and/or photo-receiving device with a metal optical separation grid according to a second embodiment.

According to a second embodiment, it is possible that during the production of the optical separation grid 140, after removing the mask 148, one or more wavelength converting elements 162 of a radiation intended for being emitted and/or received by the component 102 is arranged between portions of the optical separation grid 140. Such an element 162 may be coupled to one or more components 102 on the device 100, or all the components 102 of the device 100. FIG. 22 shows the optical separation grid 140 as well as the components 102 with which the elements 162 are associated.

The elements 162 may include phosphorus, such as for example particles of phosphorus arranged in a glass matrix of the sol-gel type or polymer of the silicone and/or acrylic type for example.

The fastening is in this case implemented at a temperature that does not degrade these elements 162.

Figure 23:
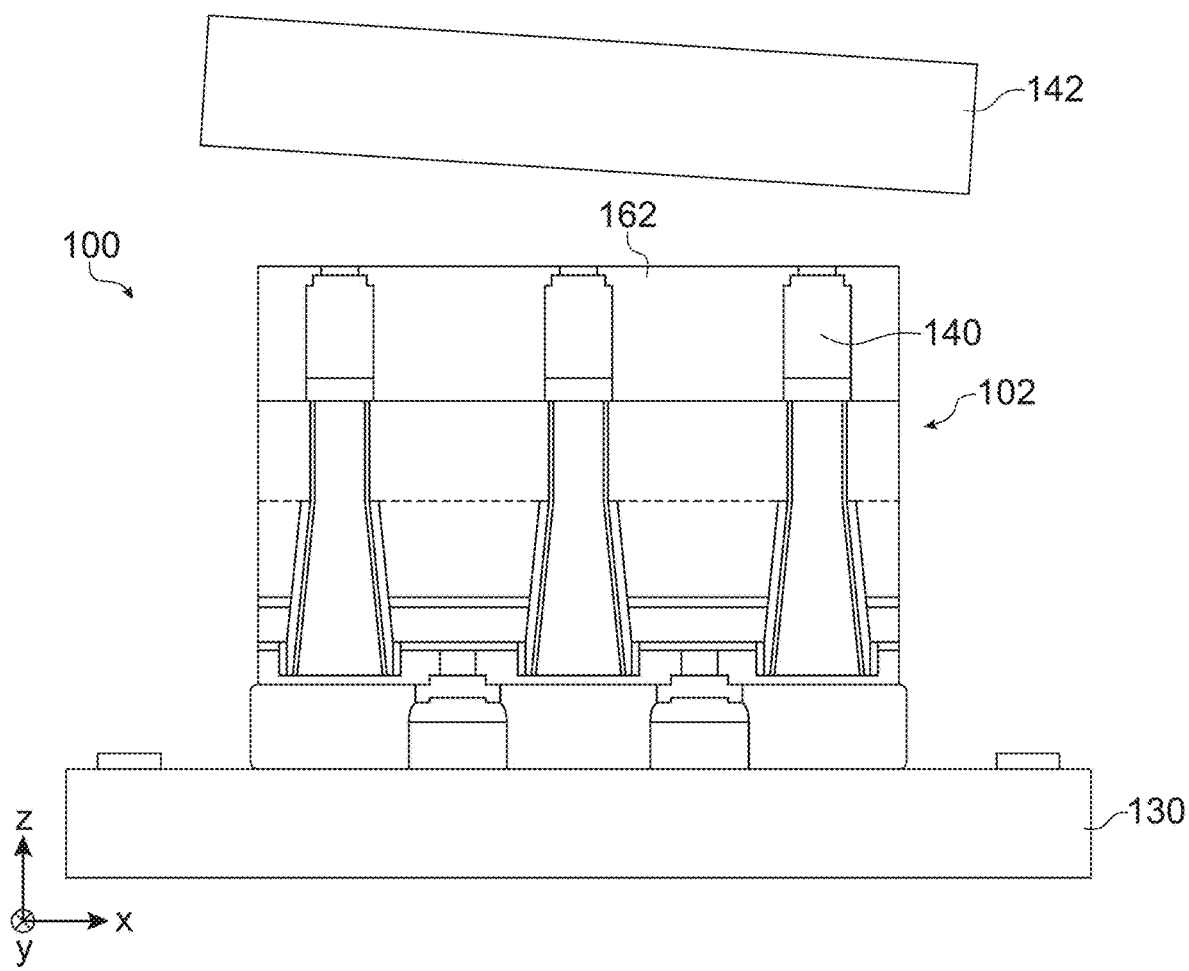

After the fastening of the optical separation grid 140 to the first electrodes 110, the wavelength converting elements are arranged facing semiconductor stacks of the components 102, as can be seen in FIG. 23.

In the first and second particular embodiments described hereinabove, the components 102 are electrically coupled to the electronic control circuit 130, then the optical separation grids 140 are then transferred onto the first electrodes 110 of the components 102. Alternatively, it is possible that the optical separation grids 140 are first transferred onto the first electrodes 110 of the components 102, then these components 102 (which include the optical separation grids 140) may then be coupled to the electronic control circuit 130.

For all the embodiments and alternatives described hereinabove, the method for producing the device 100 may be implemented in different ways:

chip by chip, i.e. by individually coupling each one of the devices 100 with an independent optical separation grid, or chip to substrate, i.e. by producing several devices 100 then by fastening them on a common substrate and finally by collectively assembling the optical separation grids 140 to the first electrodes 110 of these devices 100, or substrate to substrate, i.e. by producing several devices 100 on a first substrate and by then assembling the first electrodes 110 of these devices 100 to optical separation grids 140 produced on a second substrate.

The invention claimed is:

1. A method for producing a photo-emitting and/or photo-receiving device with a metal optical separation grid, comprising at least:

producing at least one photo-emitting and/or photo-receiving component, wherein at least one first metal electrode of the photo-emitting and/or photo-receiving component covers side flanks of at least one semiconductor stack of the photo-emitting and/or photo-receiving component and extends to at least one emitting and/or receiving face of the photo-emitting and/or photo-receiving component;

treating at least one face of the first metal electrode located at the emitting and/or receiving face, rendering wettable said face of the first metal electrode;

producing of the metal optical separation grid on at least one support;

fastening of the metal optical separation grid against said face of the first metal electrode by brazing;

removing the support.

2. The method according to claim 1, wherein the photo-emitting and/or photo-receiving component includes at least one photo-emitting and/or photo-receiving diode comprising at least:

first and second portions of doped semiconductors that are part of the semiconductor stack and which form a p-n junction, a first part of the first portion of doped semiconductor being arranged between a second part of the first portion of doped semiconductor and the second portion of doped semiconductor;

dielectric portions that cover side flanks of the first part of the first portion of doped semiconductor and side flanks of the second portion of doped semiconductor;

a second electrode electrically coupled to the second portion of doped semiconductor and such that the second portion of doped semiconductor is arranged between the second electrode and the first portion of doped semiconductor;

and wherein the first metal electrode is arranged against outer side flanks of the dielectric portions and against side flanks of the second part of the first portion of doped semiconductor such that the first metal electrode is electrically coupled to the first portion of doped semiconductor and electrically insulated from the second portion of doped semiconductor.

3. The method according to claim 1, further including, between the production of the photo-emitting and/or photo-receiving component and the treatment of the face of the first metal electrode, or after the removing of the support, an electrical and mechanical coupling of the photo-emitting and/or photo-receiving component, on the side opposite the emitting and/or receiving face, to at least one electronic control circuit.

4. The method according to claim 1, wherein the treatment of the face of the first metal electrode includes a deposition of at least one wettable material on the face of the first metal electrode, or, when the first metal electrode includes at least one first wettable metal material covered by at least one second non-wettable material, an etching of the second non-wettable material present on the face of the first metal electrode.

5. The method according to claim 1, further including, between the producing of the metal optical separation grid and the fastening of the metal optical separation grid, the deposition of at least one brazing material on the metal optical separation grid.

6. The method according to claim 1, wherein the metal optical separation grid is produced on the support with at least one sacrificial layer arranged between the metal optical separation grid and the support, and wherein the removing of the support is produced by suppressing the sacrificial layer.

7. The method according to claim 6, wherein:

the material of the sacrificial layer is able to be selectively etched with regards to the material of the metal optical separation grid;

the method further includes, between the producing of the metal optical separation grid and the fastening of the metal optical separation grid, a partial etching of the sacrificial layer such that remaining portions of the sacrificial layer are located between the metal optical separation grid and the support;

the removing of the support is produced by suppressing the remaining portions of the sacrificial layer.

8. The method according to claim 6, wherein:

the sacrificial layer includes at least one material able to be dissolved in a solvent, and wherein the removing of the support includes at least one putting of the sacrificial layer into contact with the solvent generating a dissolution of the material of the sacrificial layer, or the sacrificial layer includes at least polyimide, and wherein the removing of the support includes at least one putting of the sacrificial layer into contact with a plasma generating an etching of the polyimide.

9. The method according to claim 1, wherein:

the metal optical separation grid is produced on the support with at least one temporary adhesive layer arranged between the metal optical separation grid and the support;

the temporary adhesive layer includes at least one material of which the adhesive properties are able to be degraded starting from a given temperature that said material is exposed to, and the fastening of the metal optical separation grid is implemented at temperature greater than or equal to said given temperature.

10. The method according to claim 1, wherein:

the metal optical separation grid is produced on the support with at least one temporary adhesive layer arranged between the metal optical separation grid and the support;

the temporary adhesive layer includes at least one material of which the adhesive properties are able to be degraded when said material is exposed to electromagnetic radiation, and the removing of the support includes at least one exposure of the temporary adhesive layer to the electromagnetic radiation through the support.

11. The method according to claim 1, wherein:

the metal optical separation grid is produced on the support with at least one oxide layer and at least one platinum layer arranged between the metal optical separation grid and the support;

the removing of the support includes at least one mechanical separation at the interface between the oxide layer and the platinum layer.

12. The method according to claim 1, wherein the producing of the metal optical separation grid further includes the producing, on the support, of at least one wavelength converting element of a radiation intended for being emitted and/or received by the photo-emitting and/or photo-receiving component, arranged between portions of the metal optical separation grid such that after the fastening of the metal optical separation grid, the wavelength converting element is arranged facing the semiconductor stack of the photo-emitting and/or photo-receiving component.

13. The method according to claim 12, wherein the wavelength converting element includes phosphorus.

14. The method according to claim 1, wherein:

several photo-emitting and/or photo-receiving components are produced and form a pixel matrix of the photo-emitting and/or photo-receiving device;

the first metal electrode is arranged around each one of the photo-emitting and/or photo-receiving components and is common to the photo-emitting and/or photo-receiving components.

* * * * *